(12) United States Patent
Brun et al.

(10) Patent No.: US 9,698,108 B1
(45) Date of Patent: Jul. 4, 2017

(54) STRUCTURES TO MITIGATE CONTAMINATION ON A BACK SIDE OF A SEMICONDUCTOR SUBSTRATE

(71) Applicant: Intel Corporation, Santa Clara, CA (US)

(72) Inventors: Xavier F. Brun, Chandler, AZ (US); Shweta Agrawal, Gilbert, AZ (US); Hao Wu, Chandler, AZ (US); Mohit Mamodia, Chandler, AZ (US); Shengquan E. Ou, Chandler, AZ (US); Hualiang Shi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,096

(22) Filed: Dec. 23, 2015

(51) Int. Cl.
*H01L 21/78* (2006.01)
*H01L 23/58* (2006.01)
*H01L 23/48* (2006.01)
*H01L 23/528* (2006.01)
*H01L 21/768* (2006.01)

(52) U.S. Cl.
CPC ...... *H01L 23/585* (2013.01); *H01L 21/76885* (2013.01); *H01L 21/76898* (2013.01); *H01L 21/78* (2013.01); *H01L 23/481* (2013.01); *H01L 23/5283* (2013.01)

(58) Field of Classification Search
CPC ....... H01L 2924/01; H01L 2924/01029; H01L 2924/01078; H01L 2924/01079; H01L 23/48; H01L 23/481; H01L 23/52; H01L 23/5226; H01L 21/76; H01L 21/768; H01L 21/7688; H01L 21/76885; H01L 21/7689; H01L 21/76898; H01L 21/78

USPC ........................................................ 257/774
See application file for complete search history.

(56) References Cited

U.S. PATENT DOCUMENTS 7,226,812 B2    6/2007  Lu et al.
7,315,087 B2    1/2008  Huggins
8,004,678 B2    8/2011  Weiss et al.
(Continued)

FOREIGN PATENT DOCUMENTS

EP          2273549          1/2011

OTHER PUBLICATIONS

International Search Report and Written Opinion for PCT Patent Application No. PCT/US16/56860 mailed Jan. 10, 2017. 12 pgs.

*Primary Examiner* — Monica D Harrison
(74) *Attorney, Agent, or Firm* — Blakely, Sokoloff, Taylor & Zafman LLP

(57) ABSTRACT

Techniques and mechanisms to mitigate contamination of redistribution layer structures disposed on a back side of a semiconductor substrate. In an embodiment, a microelectronics device includes a substrate and integrated circuitry variously formed in or on a front side of the substrate, where vias extend from the integrated circuitry to a back side of the substrate. A redistribution layer disposed on the back side includes a ring structure and a plurality of raised structures each extending from a recess portion that is surrounded by the ring structure. The ring structure and the plurality of raised structures provide contact surfaces for improved adhesion of dicing tape to the back side. In another embodiment, the plurality of raised structures includes dummification comprising dummy structures that are each electrically decoupled from any via extending through the substrate.

24 Claims, 10 Drawing Sheets

(56) References Cited

U.S. PATENT DOCUMENTS

| | | |
|---|---|---|
| 8,395,241 B2 | 3/2013 | Yang et al. |
| 8,395,267 B2 | 3/2013 | Roozeboom et al. |
| 8,704,336 B2 | 4/2014 | He et al. |
| 2003/0100143 A1 | 5/2003 | Mulligan et al. |
| 2005/0136622 A1 | 6/2005 | Mulligan et al. |
| 2007/0290300 A1* | 12/2007 | Kawakami ........ H01L 21/76898 257/621 |
| 2008/0122078 A1 | 5/2008 | He et al. |
| 2010/0096731 A1 | 4/2010 | Do et al. |
| 2012/0228777 A1 | 9/2012 | Yang et al. |
| 2014/0117470 A1 | 5/2014 | Baskaran et al. |
| 2014/0191419 A1 | 7/2014 | Mallik et al. |
| 2014/0197540 A1 | 7/2014 | Do et al. |
| 2014/0252632 A1 | 9/2014 | Barth et al. |
| 2015/0217998 A1 | 8/2015 | Magnus et al. |

* cited by examiner

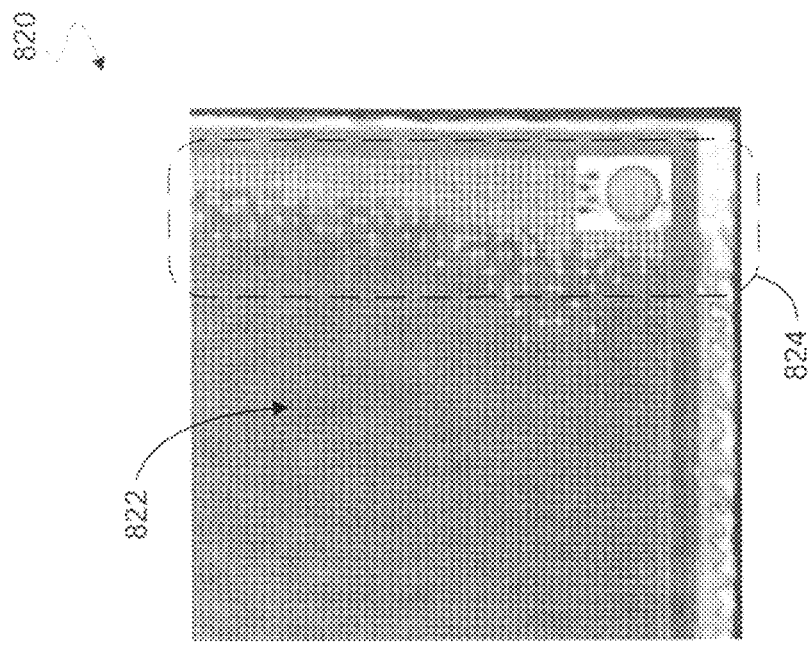
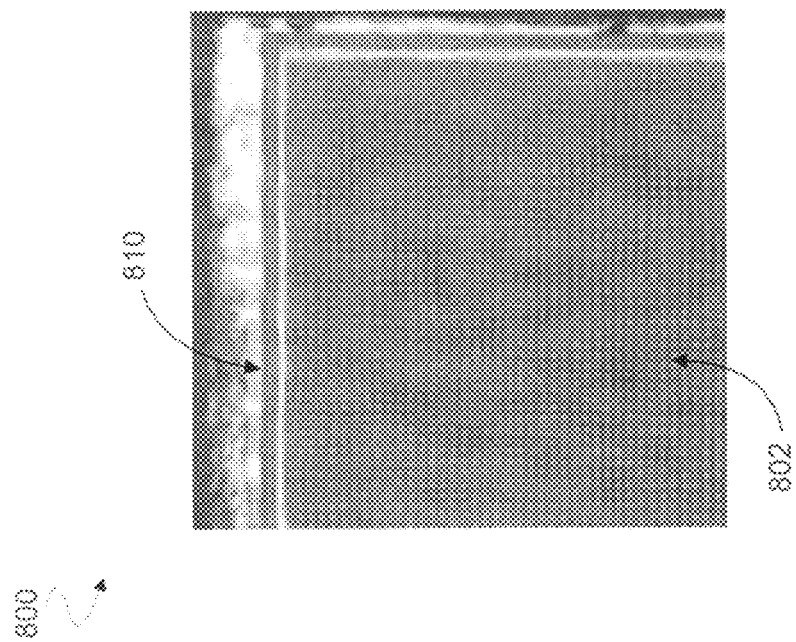
FIG. 8

US 9,698,108 B1

STRUCTURES TO MITIGATE CONTAMINATION ON A BACK SIDE OF A SEMICONDUCTOR SUBSTRATE

BACKGROUND

1. Technical Field

This disclosure relates generally to semiconductor processing, and in particular but not exclusively, relates to dicing of a semiconductor wafer.

2. Background Art

In existing techniques for the production of microelectronic devices, integrated circuitry is formed in and on one side (typically referred to as a "front side") of a wafer which is usually comprised primarily of silicon, although other materials such as gallium arsenide and indium phosphide may be used. After the integrated circuitry has been subjected to preliminary testing for functionality (wafer sort), the wafer is diced (cut apart). One exemplary microelectronic wafer dicing process uses a circular diamond-impregnated dicing saw. Prior to dicing, a sticky tape is mounted on an opposite side ("back side") of the wafer. The tape continues to hold the microelectronic die after the dicing operation and during transport to a next assembly step. During cutting, the saw generally cuts into the tape to up to about one-third of its thickness.

As successive generations of microelectronics devices continue to scale in size and the degree of circuit integration, such devices are increasingly sensitive to contamination that results from fabrication processes. Important to addressing the problem of such contamination is the identification of where contamination is occurring, what specific processing is the cause of contamination, and techniques to mitigate the contamination with improved or alternative processing.

BRIEF DESCRIPTION OF THE DRAWINGS

The various embodiments of the present invention are illustrated by way of example, and not by way of limitation, in the figures of the accompanying drawings and in which:

FIG. 8 shows a microscopic view of an integrated circuit die according to an embodiment.

DETAILED DESCRIPTION

Figure 1:
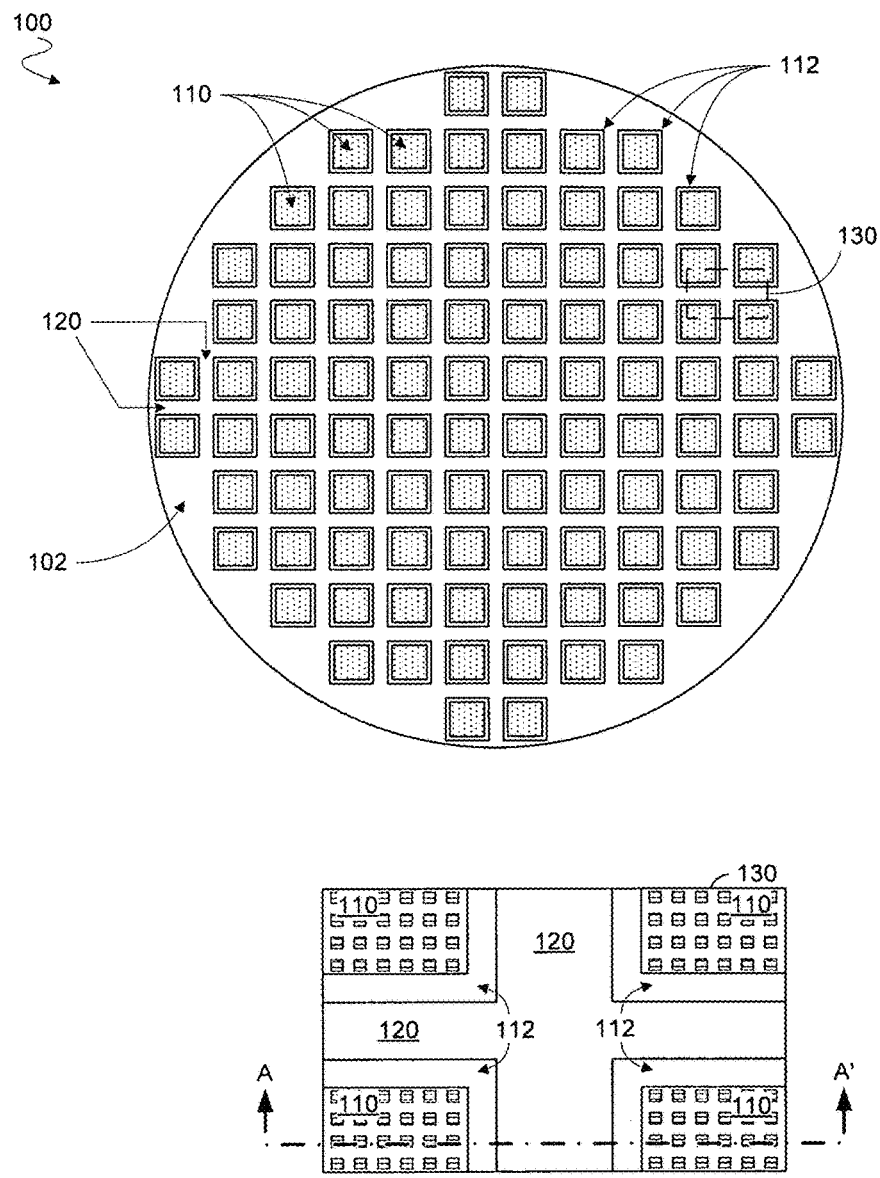
FIG. 1 is a top plan view of a microelectronic device wafer having back side structures according to an embodiment.

Embodiments discussed herein variously provide techniques and mechanisms for mitigating contamination due to an intrusion of slurry formed during dicing of a semiconductor wafer. Certain embodiments are discussed herein with reference to a microelectronics device (e.g., a wafer or an integrated circuit chip) including a semiconductor substrate and structures variously formed therein or thereon. As used herein, "front side" refers to a side of a substrate in which and/or on which integrated circuitry is formed—e.g., wherein access to such integrated circuitry is provided with via structures that extend at least partially through the substrate. Some or all such via structures (also referred to herein as a "through-substrate vias" or "TSVs") may variously extend to an opposite side, or "back side," of the substrate.

Integrated circuitry in or on a substrate's front side may include any of a variety of active components such as metal-oxide-semiconductor (MOS)—e.g., complementary MOS (CMOS)—and/or other transistors. At least partial electrical isolation between various ones of such active components may be provided by isolation structures—e.g., including shallow trench isolation regions—that extend to the front side. Also formed on the front side may be a metal stack including, for example, layers of metallization disposed in dielectric material. Conductive structures of the metal stack may variously interconnect integrated circuit structures disposed on the front side.

In an embodiment, the microelectronics device includes a redistribution layer formed directly or indirectly on the back side of a substrate. As used herein, "redistribution layer" refers to a layer including conductive structures that provide for contacts to access TSVs to be redistributed for various coupling to respective structures—e.g., including bumps, pads or other interface contacts—in or on an opposite side of the redistribution layer. The redistribution layer may include, or be formed on, a surface from which at least some structures of the redistribution layer (referred to herein as "raised structures") extend in a direction away from the semiconductor wafer. A first type of such raised structures (for brevity, referred to herein as "interconnect structures") may be electrically coupled each to a respective TSV disposed in the substrate. A second type of such raised structures (referred to herein as "dummy structures" or "dummification") are each electrically decoupled from any such TSVs.

In some embodiments, a redistribution layer includes one or more ring structure that each surround both interconnect structures and dummy structures. Such one or more ring structures may provide one or more contact surfaces for adhering to dicing tape. During dicing of a wafer, contact between the dicing tape and the one or more ring structures may prevent or otherwise mitigate an intrusion of slurry into a region surrounded by the one or more ring structures. In some embodiments, adhesion of the dicing tape to the wafer may be improved by further contact surfaces provided by other raised structures surrounded by the one or more ring structures. The improved adhesion may mitigate the possibility of dicing tape separating from a back side of a wafer during dicing (or at least mitigate an extent of such separating).

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices—e.g., including a printed circuit board or a packaged device—that is or includes an integrated circuit die having back side redistribution layer structures as described herein.

FIG. 1 shows features of a wafer 100 including structures to mitigate back side contamination according to an embodiment. Wafer 100 is one example of a microelectronics device including structures formed on the back side of a semiconductor substrate—e.g., where the structures aid in the adhesion of dicing tape used during dicing of the wafer. Improved adhesion of such dicing tape may reduce the chance of slurry intruding onto redistribution layer structures and/or other structures of the wafer (or of an IC die formed from the wafer).

As shown in FIG. 1, a back side 102 of wafer 100 includes street regions 120 along which wafer 100 may be subsequently diced to singulate IC dies. Dicing tape (not shown) may be applied to back side 102 prior to such dicing. The dicing tape may aid in controlling the position of singulated IC dies during dicing and/or the handling of IC dies after dicing of wafer 100. Such dicing may take place after testing of integrated circuitry (not shown) disposed in or on a front side of wafer 100 (opposite side 102). One exemplary microelectronic wafer dicing process uses a circular diamond-impregnated dicing saw, which travels down two mutually perpendicular sets of dicing streets 120 lying between each of the rows and columns.

In the illustrative embodiment shown, back side 102 has disposed thereon one or more ring structures 112 each surrounding a respective one of regions 110. A ring structure 112 may be formed in a redistribution layer on back side 102 and may prevent or otherwise mitigate an intrusion of contaminants into a corresponding region 110. For example, ring structures 112 may be substantially rectangular and/or arranged in rows and columns, where two sets of mutually parallel dicing street regions 120 extend perpendicular to each other over substantially the entire surface of side 102, the street regions 120 each between respective ones of discrete ring structures 112. Dicing street regions 120 may be sized to allow passage of a wafer saw blade between two of ring structures 112 without causing damage to structures in regions 110.

As shown in detail view 130 of back side 102, a region 110 may include or be formed on a surface (for brevity, referred to herein as a "recess portion") from which various structures of the redistribution layer extend in a direction away from the substrate. Redistribution layer structures extending from such a recess portion are referred to herein as "raised structures." Some or all of regions 110 may each have formed therein raised structures that, for example, aid in adhesion of dicing tape to back side 102.

Structures formed on a back side of a wafer are expected to decrease in size, and/or increase in number and variety, with successive generations of fabrication technologies. Circuitry fabricated by next-generation processing will typically be more sensitive to levels of contamination that were previously considered to be acceptable. Certain embodiments are based on a realization that these levels of contamination take place under dicing tape, and that the adhesion of dicing tape at a back side of a wafer is inadequate to prevent such levels of contamination. In providing, on the back side of a substrate, both raised redistribution layer structures and a surrounding ring structure, some embodiments variously mitigate a type of contamination—which is not addressed by current techniques—resulting from poor adhesion of dicing tape.

Figure 2:
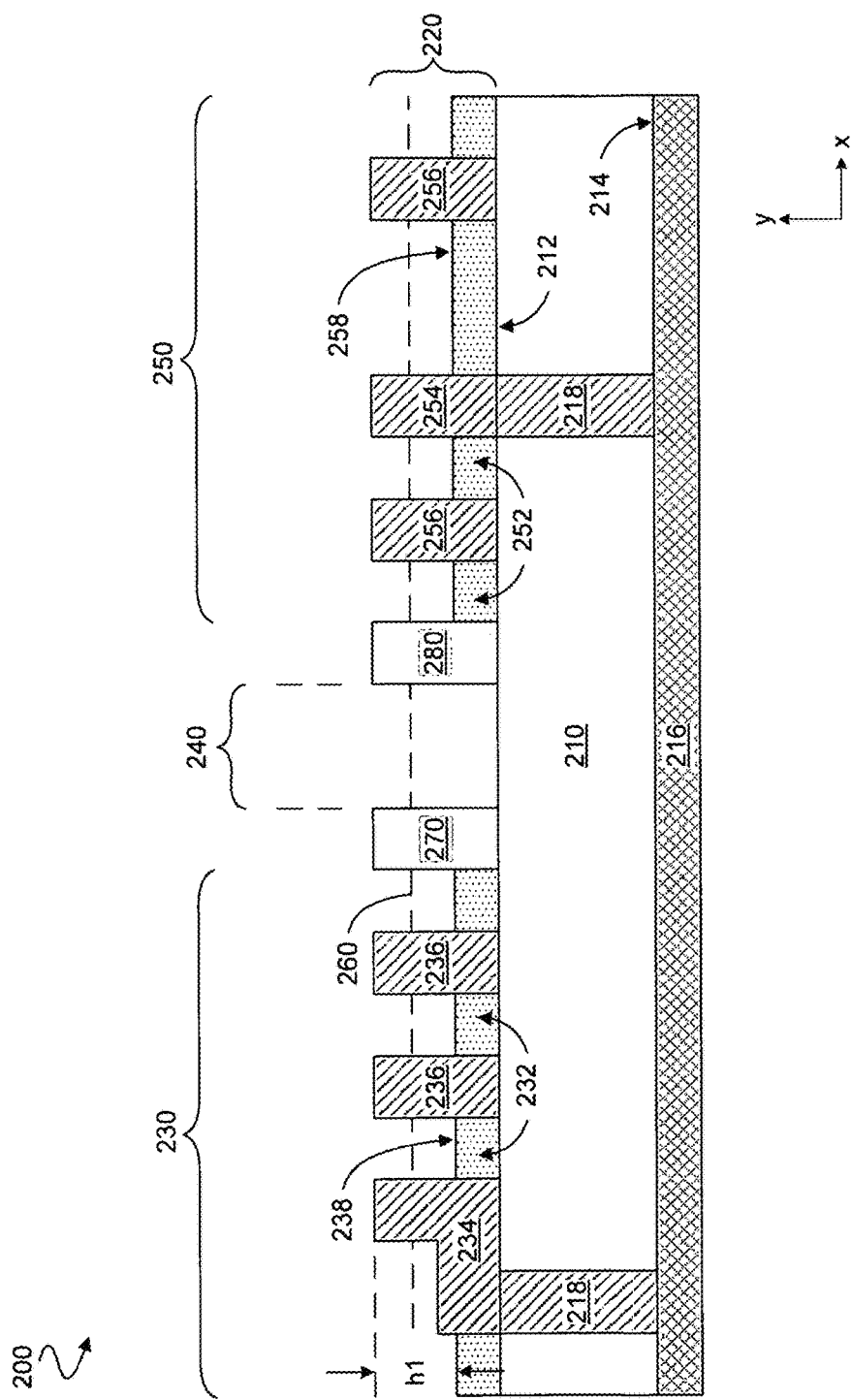
FIG. 2 is a side cross-sectional view of a microelectronic device wafer according to an embodiment.

FIG. 2 shows features of a semiconductor wafer 200 including structures to mitigate contamination according to an embodiment. In an embodiment, wafer 200 includes some or all of the features of wafer 100—e.g., where the cross-sectional side view shown in FIG. 2 corresponds to the cross-sectional line A-A' shown in detail view 130.

Wafer 200 includes a substrate 210, redistribution layer 220 formed on a back side 212 of substrate 210, integrated circuitry 216 variously formed in or on a front side 214 opposite back side 212, and vias 218 variously extending at least in part through substrate 210 between integrated circuitry 216 and back side 212. Structures formed on back side 212 may be configured to operate as at least part of a logic/memory interface (LMI), for example.

In an embodiment, redistribution layer 220 includes raised structures that variously extend from back side 212 (and/or from material disposed on back side 212) in a direction away from substrate 210. The raised structures may be variously disposed in regions on back side 212 that are each encircled by a respective one of multiple ring structures in redistribution layer 220. By way of illustration and not limitation, redistribution layer 220 may include ring structures 270, 280 each encircling a respective one of regions 230, 250 on back side 212. The view of wafer 200 in FIG. 2 shows only part of the respective cross-sections of ring structures 270, 280. Ring structures 270, 280 may adjoin opposite sides of a street region 240 where dicing of wafer 200 may be performed. For example, street region 240 may include relatively few, or no, interconnect structures and/or dummification, as compared to regions 230, 250.

In the illustrative embodiment shown, region 230 includes a dielectric 232 disposed on back side 212, where a surface 238 of dielectric 232 forms a recess region from which extends raised structures that include, for example, an interconnect structure 234 and dummy structures 236. Interconnect structure 234 may be coupled to one of vias 218 at back side 212. By contrast, dummy structures 236 may be electrically decoupled from (at least partially isolated electrically from) any via extending through substrate 210. Alternatively or in addition, region 250 may include a dielectric 252 and raised structures that variously extend from a surface 258 of dielectric 252. Raised structures of region 250 may include, for example, an interconnect structure 254 coupled to another of the vias 218, as well as dummy structures 256 electrically decoupled from any such vias.

Interconnect structures of regions 230, 250 may variously provide a redistribution of contact points for electrical coupling to respective ones of vias 218. In the example embodiment shown, interconnect structure 234 provides for both vertical (y-axis) and horizontal (x-axis) translation of one such contact point, whereas interconnect structure 254 merely provides for a vertical translation. Although interconnect structure 234, 254 are shown as being directly coupled to respective ones of vias 218, one or more raised interconnect structures of a redistribution layer may instead be coupled to a metal pad or other conductive structure (not shown) formed on respective vias at a back side of a substrate.

In an embodiment, ring structures 270, 280 and/or respective raised structures of regions 230, 250 provide additional contact surfaces—e.g., other than merely those provided by raised interconnect structures—to aid in adhesion of wafer 200 to dicing tape. For example, ring structure 270 may surround a portion of a plane 260 that extends in redistribution layer 220 (above surfaces 238, 258), where the surrounded portion of plane 260 has a given area and where raised structures in region 230 occupy at least some minimum amount (e.g., 30%) of that area. Alternatively or in addition, raised structures in region 250 may occupy some minimum amount (e.g., 30%) of the portion of plane 260 that is surround by ring structure 280. In some embodiments, dicing tape adhesion is further promoted by some or all raised structures and ring structures in redistribution layer 220 having similar y-axis heights. For example, interconnect structures and dummy structures in region 230 may have an average height that is within 15% (e.g., within 10%) of a height h1 of ring structure 270. Alternatively or in addition, interconnect structures and dummy structures in region 250 may have an average height that is within 15% of the height of ring structure 280.

Dielectrics 232, 252—e.g., including silicon nitride—are merely one example of materials that may form respective recess regions at back side 212. Raised structures of regions 230, 250 may variously extend from any of a variety of additional or alternative materials including, but not limited to, hard mask material, liner material, titanium (Ti) barrier, redistribution layer copper, a metal diffusion barrier and/or the like. In some embodiments, wafer 200 omits dielectrics 232, 252, wherein raised structures extend from an exposed surface at back side 212.

In an illustrative scenario according to one embodiment, a thickness (y-axis) of dielectrics 232, 252 is in a range of 20 nm to 40 nm, for example. Alternatively or in addition, a height (y-axis) of a raised structure (or of a ring structure encircling such a raised structure) may be 3 μm or more—e.g., in a range of 4 μm to 6 μm. Such a height h1 may be measured, for example, from plane 260 or the surface of a respective recess portion from which the raised structure (or ring structure) extends. In an embodiment, a smallest cross-sectional width (x-axis) of one side of a ring structure is 3 μm or more. However, such a cross-sectional width may be significantly larger than 3 μm—e.g., in a range of 10 μm to 25 μm. The example dimensions mentioned above may vary widely, in different embodiments, according to implementation-specific details. For example, some or all such dimensions may be an order of magnitude larger (or more) in embodiments adapted from older fabrication processing techniques.

Figure 3:
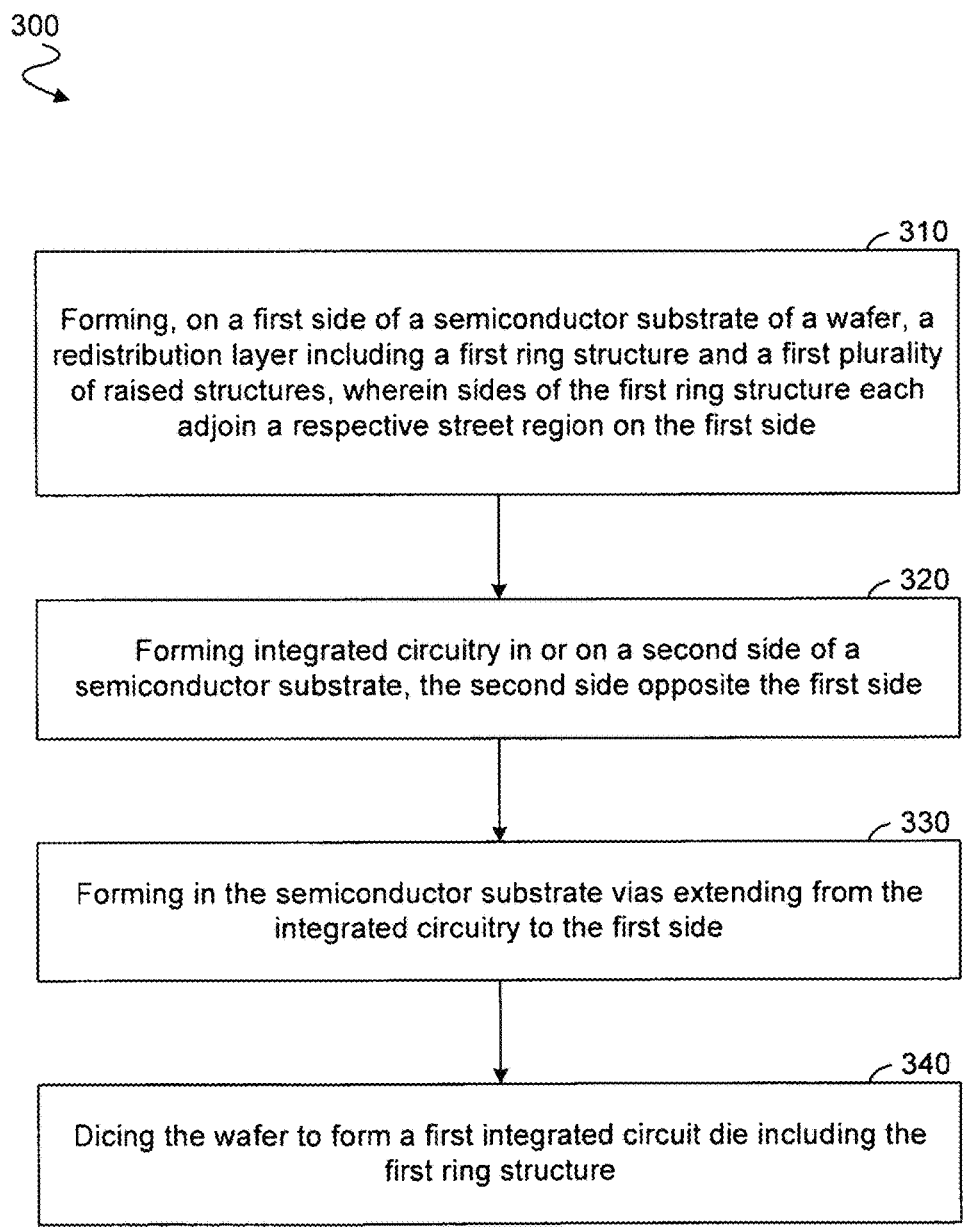
FIG. 3 is a flow diagram illustrating elements of a method for processing a semiconductor wafer according to an embodiment.

FIG. 3 shows features of a method 300 to provide a microelectronics device according to an embodiment. Method 300 may include operations to fabricate a wafer (e.g., one of wafers 100, 200), structures in or on the wafer and/or an IC die that is singulated from the wafer.

Method 300 may include processing a semiconductor substrate of a wafer, including processing in or on a first side (that is to serve as a back side) of the semiconductor substrate. For example, method 300 may include, at 310, forming on the first side of the substrate a redistribution layer that includes a first ring structure and a first plurality of raised structures, wherein sides of the first ring structure each adjoin a respective street region on the first side. Formation of the redistribution layer at 310 may include operations adapted from conventional techniques—e.g., including any of various mask, photoresist (photolithography), etch, sputter, plating and/or other processing—to form conductive and/or other structures in or on a back side of a semiconductor wafer.

The first plurality of raised structures may each extend from a recess portion that is also surrounded by the first ring structure—e.g., where the first ring structure adjoins and defines a periphery of the recess portion. The recess portion may include part of the first side of the wafer and/or some or all of a dielectric (or other) material formed on the first side. The first ring structure may surround the recess portion and the first plurality of raised structures—e.g., where the first plurality of raised structures includes all raised structures surrounded by the first ring structure.

Forming the redistribution layer at 310 may include forming multiple ring structures of the redistribution layer and, for each of the multiple ring structures, a respective plurality of raised structures. For each of one or more ring structures, the given ring structure may surround a respective recess portion, wherein the respective plurality of raised structures variously extend from the respective recess portion. Although embodiments are not limited in this regard, the first plurality of raised structures may comprise one or more other ring structures that surround some or all others of the first plurality of raised structures.

In some embodiments, an area taken up by the first plurality of raised structures—e.g., in combination with the first ring structure—may significantly reduce the possibility that a contaminant (such as a slurry created during dicing) might encroach under or through dicing tape and onto the recess portion and/or the raised structures extending from the recess portion. For example, such improved adhesion may result at least in part from the first plurality of raised structures occupying some minimum percentage, fraction or other proportional amount of an area within a plane that extends through—and, for example, in parallel with—the redistribution layer. By way of illustration and not limitation, the first plurality of raised structures may take up at least thirty percent (30%) of a total area that is surrounded by the first ring structure in a first plane. In some embodiments, the first plurality of raised structures takes up at least fifty percent (50%)—e.g., 70% or more—of the total area surrounded by the first ring structure in such a first plane. For brevity, "cross-sectional density" is used herein, in the context of a plurality of raised structures of a redistribution layer, to refer to a proportional amount of an area that is surrounded by a ring structure in a given plane, where that amount is occupied by that plurality of raised structures.

Method 300 may further comprise operations to fabricate front side circuitry of the wafer and/or to couple such front side circuitry to one or more raised structures of the redistribution layer. For example, method 300 may further comprise, at 320, forming integrated circuitry in or on a second side of a semiconductor substrate, the second side opposite the first side. Formation of the integrated circuitry at 320 may include operations adapted from conventional processing to fabricate transistors, isolation structures, a metal stack and/or other integrated circuitry in or on a front side of a substrate. Certain embodiments are not limited with respect to particular integrated circuitry that might be formed at 320 and/or particular operations that might fabricate such integrated circuitry on the second side.

Method 300 may further comprise, at 330, forming in the semiconductor substrate vias that extend from the integrated circuitry formed at 320 to the first side. The one or more vias may be formed by any of a variety of techniques for forming through-substrate vias (TSVs), which are not detailed herein to avoid obscuring features of various embodiments. The first plurality of raised structures may include interconnect structures that are variously coupled electrically—directly or indirectly—each to a respective one of the vias formed at 330. In some embodiments, the first plurality of raised structures further comprises dummy structures that, for example, are each electrically decoupled from any via extending in the substrate. In some embodiments, a cross-sectional density of a plurality of raised structures meets or exceeds some minimum amount—e.g., 30%—due at least in part to some amount of the plurality of raised structures being dummy structures. For example, the cross-sectional density of dummy structures may account for at least half (½) of the overall cross-sectional density of the first plurality of raised structures. In some embodiments, the cross-sectional density of dummy structures accounts for at least two-thirds (⅔)—e.g., three-fourths (¾) or more—of the overall cross-sectional density of the first plurality of raised structures.

In some embodiments, improved adhesion of dicing tape may be further promoted by the first ring structure and the first plurality of raised structures having equal or similar heights—e.g., as measured from the first plane, a plane of the recess portion a plane of the first side or some other reference plane that extends in parallel with the redistribution layer. By way of illustration and not limitation, an average height of the first plurality of raised structures may be within fifteen percent (15%) of a height of the first ring structure. In some embodiments, the average height of the first plurality of raised structures is within ten percent (10%)—e.g., within five percent (5%) or less—of the height of the first ring structure.

Although some embodiments are not limited in this regard, method 300 may further comprise, at 340, dicing the wafer to form a first integrated circuit die including the first ring structure. In an embodiment, the first ring structure adjoins a periphery of the first integrated circuit die, where the periphery is formed at the first side by the dicing at 340.

Figure 4:
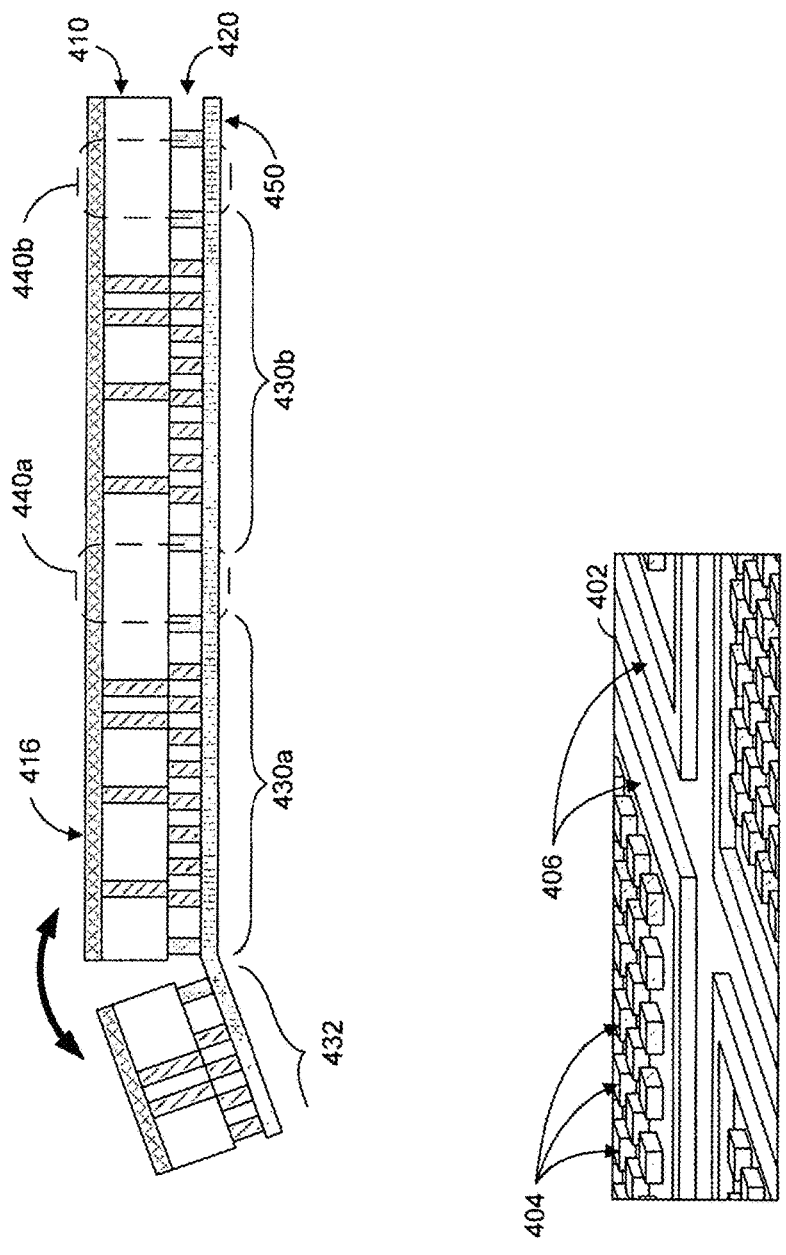
FIG. 4 shows a side cross-sectional view and a perspective view of processing to dice a microelectronic device wafer according to an embodiment.

FIG. 4 illustrates processing 400 to dice a semiconductor wafer that includes structures to mitigate back side contamination according to an embodiment. The wafer may include features of one of wafers 100, 200, for example. In an embodiment, dicing 400 includes one or more operations of method 300. The wafer may include a substrate 410, a redistribution layer 420 formed on a back side of substrate 410, integrated circuitry 416 at a front side of substrate 410, and vias variously extending at least in part through substrate 410 to couple integrated circuitry 416 with interconnect structures of redistribution layer 420.

Redistribution layer 420 includes ring structures that variously encircle and define respective regions—e.g., including regions 430a, 430b—that are to be singulated from one another by the dicing 400. As shown in detail view 402, ring structures 406 may each encircle a respective recess portion and respective raised structures 404 of redistribution layer 420 that extend from the recess portion. Sides of ring structures 406 may variously adjoin respective street regions—e.g., including street regions 440a, 440b—along which substrate 410 is to be cut by the dicing 400. At the point of processing shown in FIG. 4, dicing 400 has already singulated one IC die 432 from other regions of the wafer.

The dicing 400 may take place while dicing tape 450 is disposed on redistribution layer 420. Dicing tape 450 may aid in handling of the wafer and/or handling of singulated IC dies during or after the dicing 400. In an embodiment, adhesion of dicing tape 450 to redistribution layer 420 is aided by ring structures 406 and by raised structures 404 that are variously encircled by ring structures 406.

Figure 5:
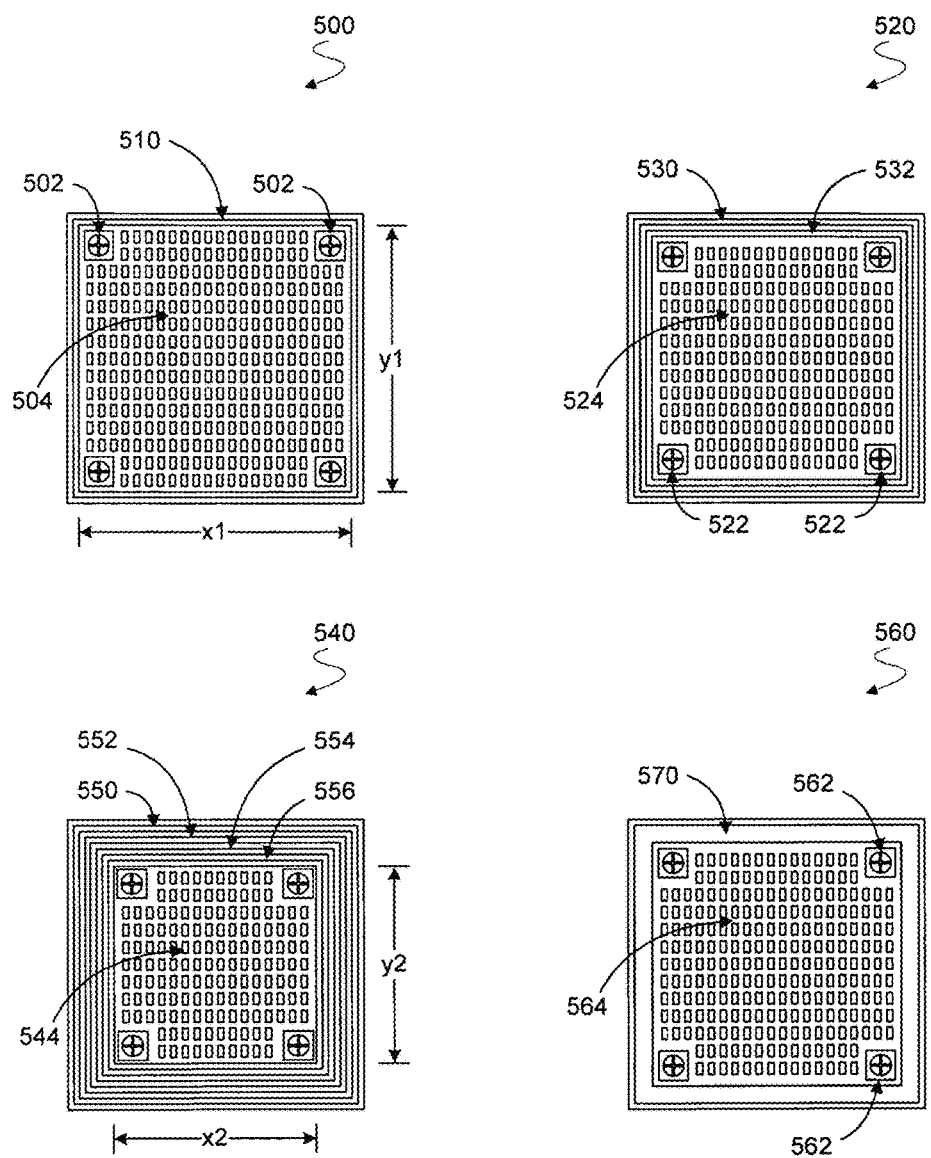
FIG. 5 shows top plan views of respective integrated circuit dies each according to a corresponding embodiment.

FIG. 5 shows respective features of various IC dies 500, 520, 540, 560 each including back side structures according to a corresponding embodiment. Fabrication of one or more of IC dies 500, 520, 540, 560 may include processing such as that of method 300, for example. In an embodiment, some or all of IC dies 500, 520, 540, 560 are formed from one of wafers 100, 200.

As shown in FIG. 5, IC die 500 may include a ring structure 510 formed on the back side of a semiconductor substrate, where a region 504 of IC die 500 is surrounded by ring structure 510. Region 504 may include raised structures of a redistribution layer. Ring structure 510 may define a width x1 and length y1 of region 504. In a plane extending parallel to the redistribution layer, the raised structures of the redistribution layer take up at least 30% of the area (x1·y1) of region 504. In one embodiment, an underfill (and/or other) material—not shown—is disposed on the recess portion and the raised structures of area 504 that extend from that recess portion. Although certain embodiments are not limited in this regard, ring structure 510 may further encircle fiducial structures 502 that are to aid in alignment of area 504 during dicing, packaging and/or other processing.

IC die 520 is one example of an embodiment wherein a redistribution layer on a back side of a semiconductor substrate includes multiple ring structures and raised structures that are surrounded by each of the multiple ring structures. In the example embodiment of IC die 520, a ring structure 530 surrounds another ring structure 532. An area 524 of IC die 520 may be further surrounded by ring structure 532 (or alternatively, may include ring structure 532). In addition to interconnect structures and dummy structures, area 524 may further include fiducial structures 522 to aid in alignment of area 524 during various processing.

IC die 540 is another example of an embodiment wherein a redistribution layer, on a substrate back side, includes multiple ring structures and raised structures surrounded by such ring structures. As shown in FIG. 5, ring structures 550, 552, 554, 556 of IC die 540 may surround a region 554, where an innermost ring structure 556 defines a width x2 and length y2 of region 544. To aid in an adhesion of dicing tape, raised structures disposed in region 544 may occupy at least 30% of the area (x2·y2) of region 544. In such an embodiment, dicing tape adhesion may be further promoted by the respective heights of the raised structures and the ring structures 550, 552, 554, 556 being within 15% of each other.

In the example embodiment of IC die 560, a redistribution layer, formed on the back side of a semiconductor substrate, includes a ring structure 570 and raised structures disposed in an area 564 that is surrounded by ring structure 570. A minimum cross-sectional width of one leg of ring structure 570 may be multiple times (for example, at least three times) the width of a raised structure—e.g., any raised structure—that is surrounded by ring structure 570. In one illustrative embodiment, directly opposite sidewalls of ring structure 570 are separated from one another by at least 20 μm. Although certain embodiments are not limited in this regard, area 564 may further include fiducial structures 562 to aid in alignment of area 564 during various processing.

Figure 6:
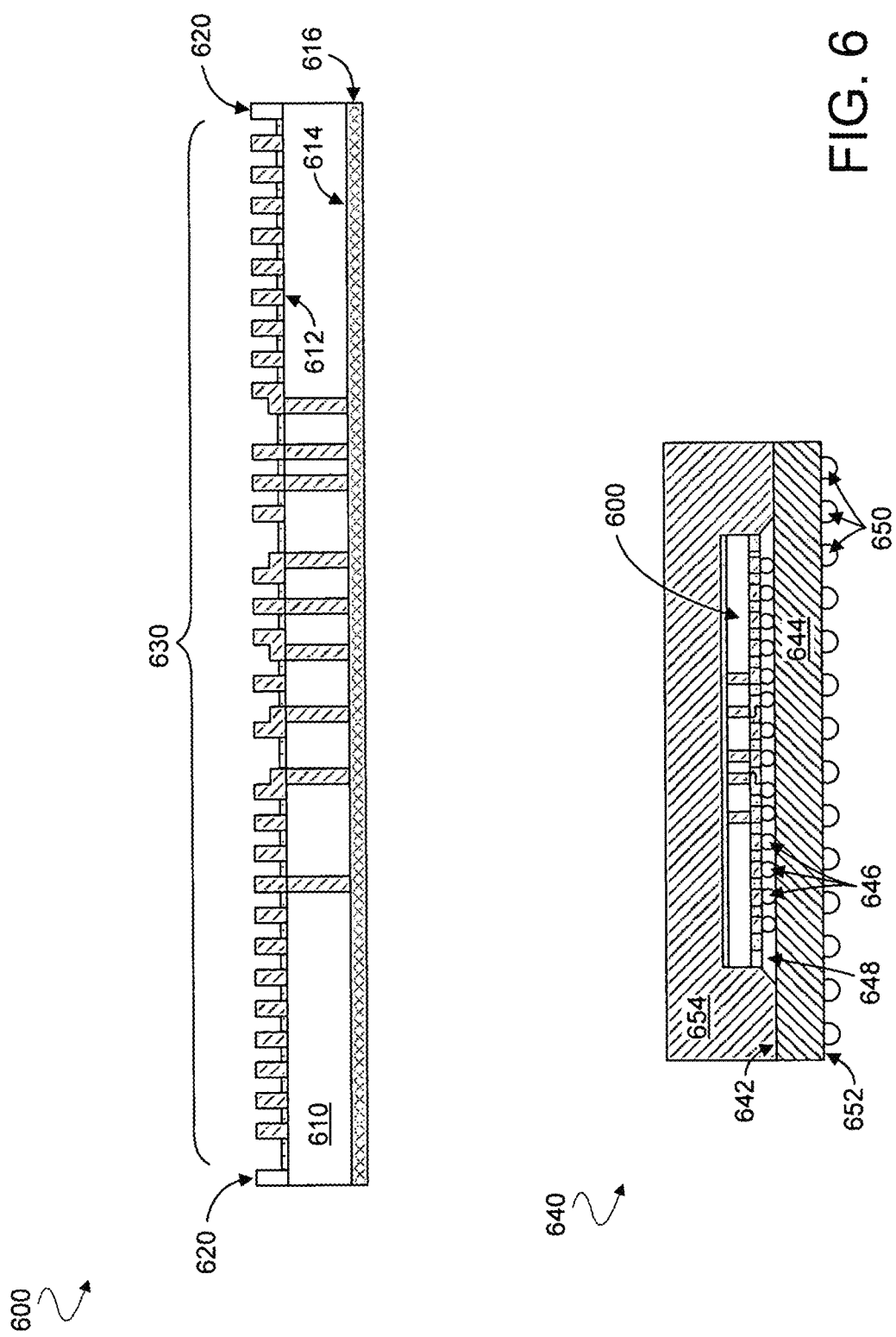
FIG. 6 shows side cross-sectional views of integrated circuit devices each according to a corresponding embodiment.

FIG. 6 illustrates, in cross-sectional view, an integrated circuit die 600 after processing such as that of dicing 400. IC die 600 may be a microprocessor, a chipset, a memory device, an ASIC, or the like. In an embodiment, IC die 600 includes features of one of IC dies 500, 520, 540, 560. IC die 600 includes a substrate 610, a redistribution layer formed on a back side 612 of substrate 610, integrated circuitry 616 variously formed in or on a front side 614 opposite back side 612, and vias variously extending at least in part through substrate 610 between integrated circuitry 616 and back side 612. The redistribution layer includes a ring structure 620 and raised structures 630 that are surrounded by ring structure 620.

FIG. 6 further shows a microelectronic device package 640, according to one illustrative embodiment, that is implemented as a flip-chip molded matrix array package. The microelectronic device package 640 may include the integrated circuit die 600 (such as a microprocessor, a chipset, a memory device, an ASIC, and the like) attached by its redistribution layer to a first surface 642 of a carrier substrate 644 (such as an interposer, a mother-board, a back surface of another microelectronic die, or the like) through a plurality of interconnects 646 (such as solder balls) that extend from bond pads (not shown) on the redistribution layer of IC die 600 to land pads (not shown) on the surface 642 of carrier substrate 644 to make electrical contact therebetween, as will be understood by those skilled in the art. An underfill material 648 may be dispersed between the redistribution layer of IC die 600 and the surface 642 of carrier substrate 644. The underfill material 648 may provide mechanical support, contamination protection, and improve package reliability. The carrier substrate 644 may also include or have disposed thereon a plurality of external contacts 650 (such as solder balls) attached to a second surface 652 thereof. Such external contacts 650 may be used to connect the package to an external component (not shown), as will be understood to those skilled in the art. The integrated circuit die 600 and surface 642 may be encapsulated in a molding material 654 to prevent physical and chemical damage. In another embodiment, IC die 600 is packaged as part of a die stack including multiple IC dies. Alternatively or in addition, interconnection mechanisms to provide access to IC die 600 in a packaged device may include one or more wire bond structures.

Figure 7:
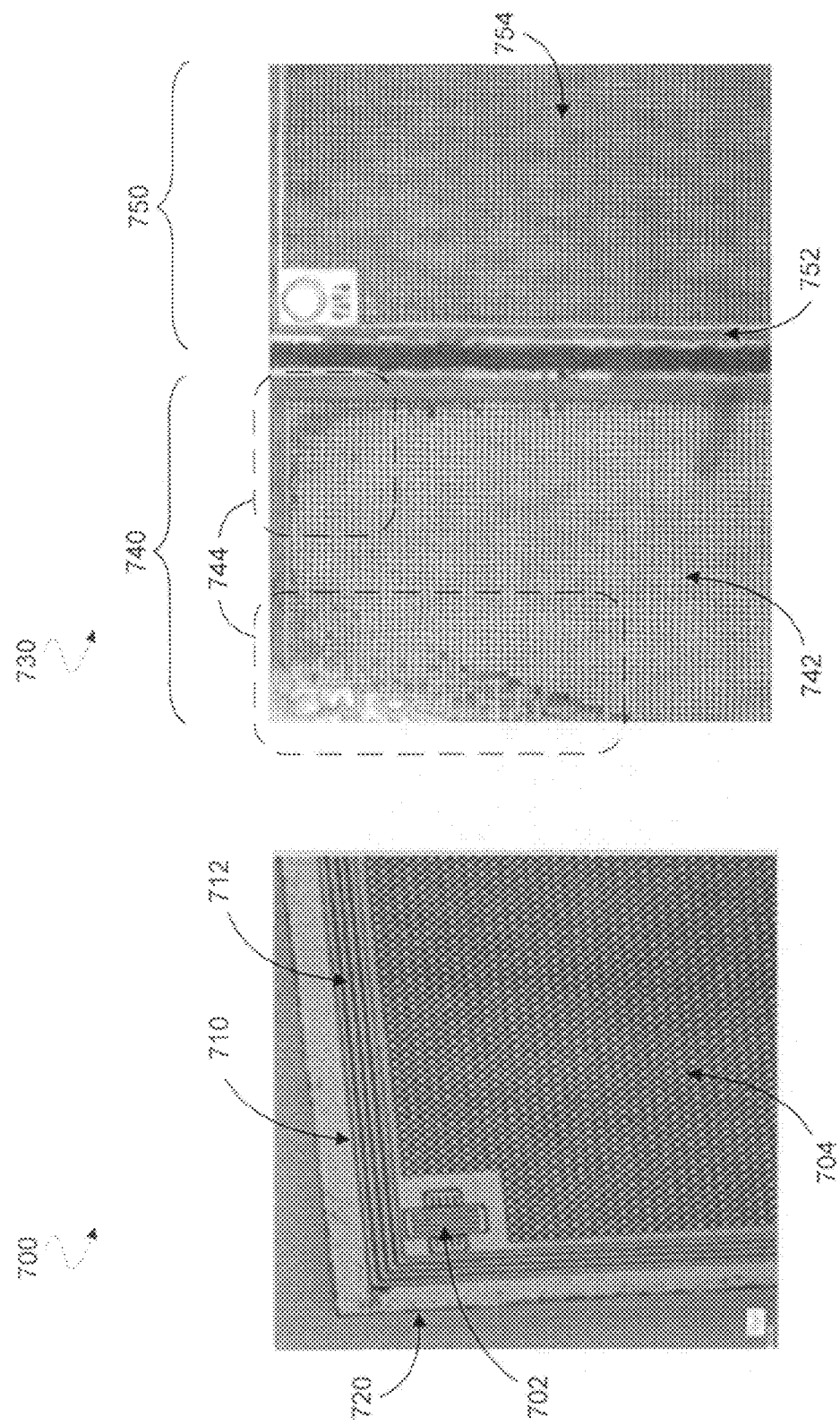
FIG. 7 shows microscopic views of respective integrated circuit dies each according to a corresponding embodiment.

FIG. 7 shows electron microscope images 700, 730 variously illustrating respective redistribution layer structures to mitigate contamination according to different embodiments. Image 700 shows an IC die including a redistribution layer formed on a back side of a semiconductor substrate, the redistribution layer comprising ring structures 710, 712 and a region 704 including raised structures surrounded by both of ring structures 710, 712. Such an IC die may include features of one of IC dies 500, 520, 540, 560, for example. Although ring structures 710, 712 are shown as being offset from (surrounded by) a periphery 720 of the IC die—e.g., the periphery 720 formed by dicing to singulate the IC die—in another embodiment, ring structure 710 may extend to adjoin periphery 720. In the embodiment illustrated in image 700, the raised structures disposed in region 704 further comprise a fiducial structure 702 to aid in the alignment of redistribution layer structures during operations to fabricate, package or otherwise process the IC die.

Image 730 shows a comparison of an IC die 750, according to one embodiment, to another IC die 740 contaminated by an intrusion of slurry during dicing operations. IC die 750—e.g. having features of one of IC dies 500, 520, 540, 560—comprises a redistribution layer formed on a back side of a semiconductor substrate, the redistribution layer comprising a ring structure 752 and a region 754 including raised structures surrounded by ring structure 752. As shown in image 730, a redistribution layer 742 of IC die 740 is not encircled by ring structure. Due at least in part to an absence of any such ring structure, portions 744 of redistribution layer 742 are contaminated by a slurry created during wafer dicing.

FIG. 8 shows electron microscope images illustrating a comparison of an IC die 800, according to one embodiment, to another IC die 820 contaminated by an intrusion of slurry. IC die 800 may have features of one of IC dies 500, 520, 540, 560, for example. In an embodiment, a redistribution layer of IC die 800 is formed on a back side of a semiconductor substrate, the redistribution layer including a ring structure 810 and a region 802 including raised structures surrounded by ring structure 810. Due at least in part to the ring structure 810 and/or a cross-sectional density of raised structures in region 802, IC die 800 is effectively free of any significant contamination in region 802. By contrast, a redistribution layer 822 of IC die 840 is not encircled by any ring structure. As a result, adhesion of dicing tape to redistribution layer 822 is relatively poor, resulting in a portion 824 of redistribution layer 822 being exposed to an intrusion of slurry during wafer dicing.

Figure 9:
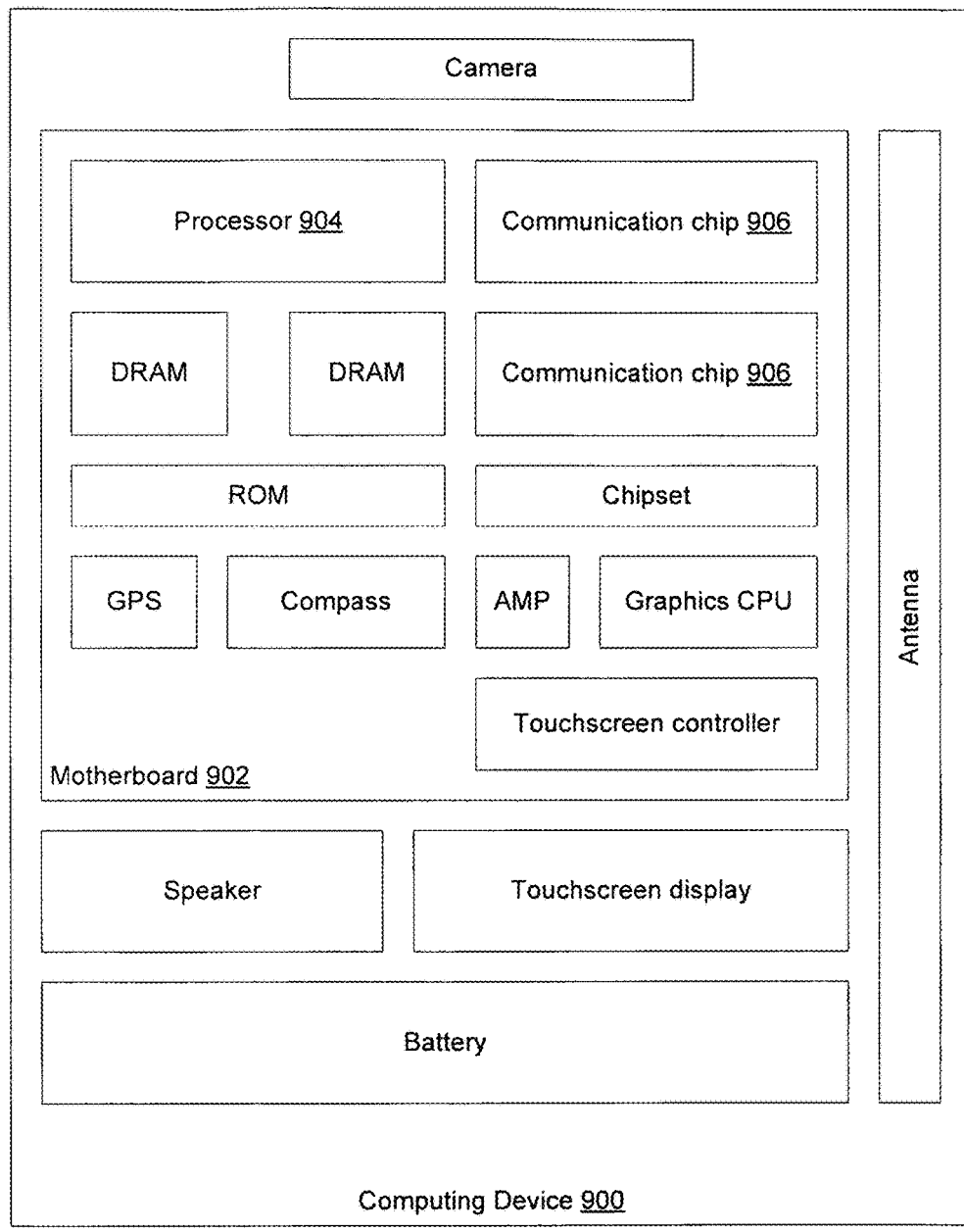
FIG. 9 is a functional block diagram illustrating a computing device in accordance with one embodiment.

FIG. 9 illustrates a computing device 900 in accordance with one embodiment. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
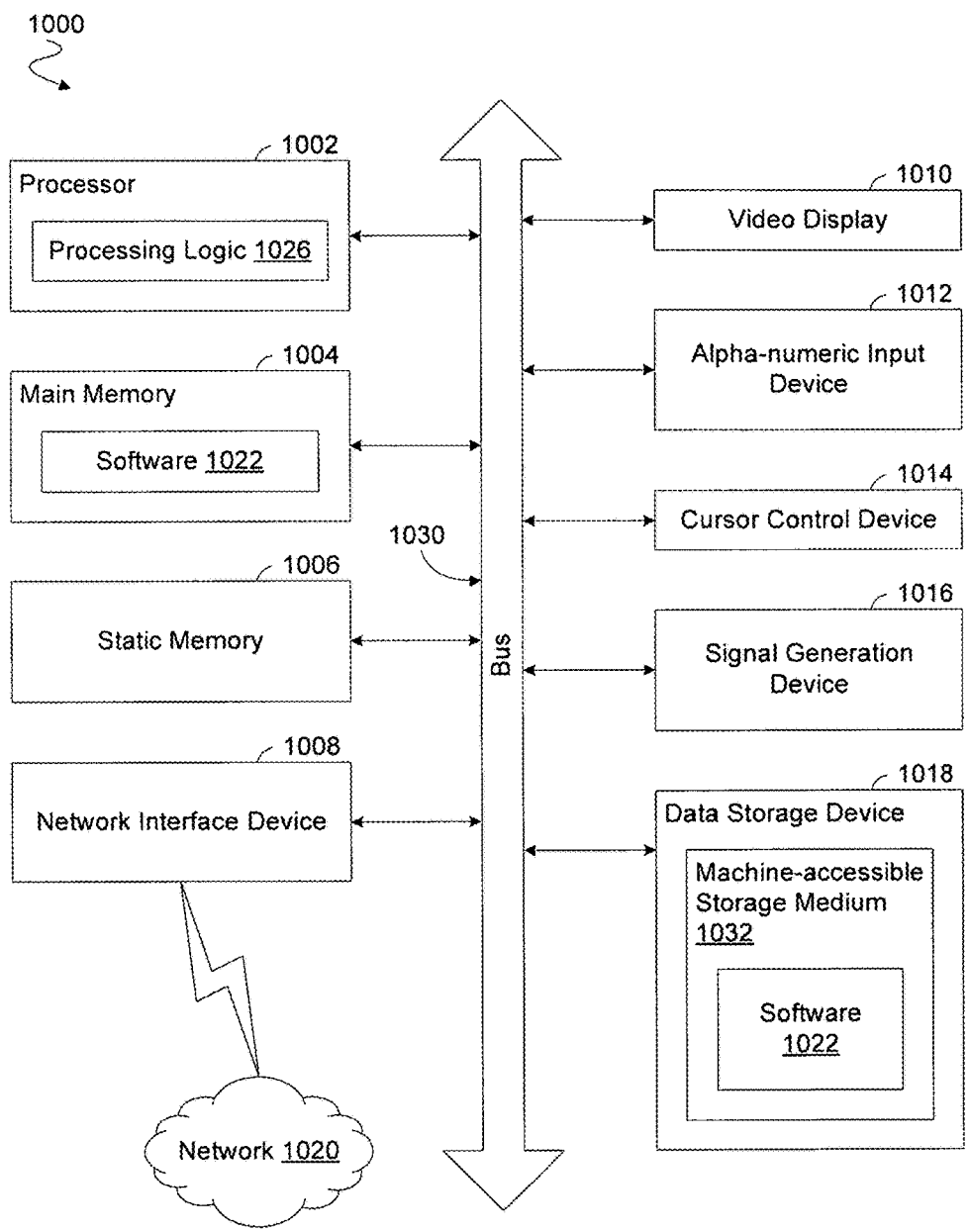
FIG. 10 is a functional block diagram illustrating an exemplary computer system, in accordance with one embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) die comprises a semiconductor substrate including a first side and a second side opposite the first side, integrated circuitry formed in or on the second side, vias extending through the semiconductor substrate from the integrated circuitry to the first side, and a redistribution layer disposed on the first side. The redistribution layer includes a first ring structure, and a first plurality of raised structures each extending from a first recess portion of the wafer, wherein the first ring structure surrounds the first recess portion and the first plurality of raised structures, wherein, for any conductive path of the IC die that extends through the first plane and further through the semiconductor substrate to couple to the integrated circuitry, the conductive path extends through the first recess portion, wherein at least thirty percent (30%) of a total area surrounded by the first ring structure in a first plane is taken up by the first plurality of raised structures.

In an embodiment, the first ring structure adjoins a periphery of the second side. In another embodiment, at least fifty percent (50%) of the total area surrounded by the first ring structure in the first plane is taken up by the first plurality of raised structures. In another embodiment, at least seventy percent (70%) of the total area surrounded by the first ring structure in the first plane is taken up by the first plurality of raised structures. In another embodiment, the first plurality of raised structures includes first interconnect structures each electrically coupled to a respective one of the vias, and dummy structures each electrically decoupled from the vias, wherein the dummy structures are at least half (½) of the first plurality of raised structures. In another embodiment, the dummy structures are at least two-thirds (⅔) of the first plurality of raised structures. In another embodiment, the dummy structures are at least three-fourths (¾) of the first plurality of raised structures. In another embodiment, an average height of the first plurality of raised structures, as measured from the first plane, is within ten percent (10%) of a height of the first ring structure. In another embodiment, the first plurality of raised structures comprises a second ring structure that surrounds others of the first plurality of raised structures. In another embodiment, the second ring structure surrounds all other of the first plurality of raised structures.

In another implementation, a wafer comprises a semiconductor substrate including a first side and a second side opposite the first side, integrated circuitry formed in or on the second side, vias extending through the semiconductor substrate from the integrated circuitry to the first side, and a redistribution layer disposed on the first side. The redistribution layer includes a first ring structure, and a first plurality of raised structures each extending from a first recess portion of the wafer, wherein the first ring structure surrounds the first recess portion and the first plurality of raised structures, wherein at least thirty percent (30%) of a total area surrounded by the first ring structure in a first plane is taken up by the first plurality of raised structures, wherein sides of the first ring structure each adjoin a respective street region on the second side.

In an embodiment, the redistribution layer further comprises multiple ring structures and, for each of the multiple ring structures, a respective plurality of raised structures, wherein, for each of the multiple ring structures the ring structure surrounds a respective recess portion of the wafer, wherein the respective plurality of raised structures each extend from the respective recess portion, wherein at least thirty percent (30%) of a total area surrounded by the ring structure in the first plane is taken up by the respective plurality of raised structures, wherein sides of the ring structure each adjoin a respective street region on the second side.

In another embodiment, the first ring structure adjoins a periphery of the second side. In another embodiment, at least fifty percent (50%) of the total area surrounded by the first ring structure in the first plane is taken up by the first plurality of raised structures. In another embodiment, at least seventy percent (70%) of the total area surrounded by the first ring structure in the first plane is taken up by the first plurality of raised structures. In another embodiment, the first plurality of raised structures includes first interconnect structures each electrically coupled to a respective one of the vias, and dummy structures each electrically decoupled from the vias, wherein the dummy structures are at least half (½) of the first plurality of raised structures. In another embodiment, the dummy structures are at least two-thirds (⅔) of the first plurality of raised structures. In another embodiment, the dummy structures are at least three-fourths (¾) of the first plurality of raised structures. In another embodiment, an average height of the first plurality of raised structures, as measured from the first plane, is within ten percent (10%) of a height of the first ring structure. In another embodiment, the first plurality of raised structures comprises a second ring structure that surrounds others of the first plurality of raised structures. In another embodiment, the second ring structure surrounds all other of the first plurality of raised structures.

In another implementation, a method comprises forming, on a first side of a semiconductor substrate of a wafer, a redistribution layer including a first ring structure, and a first plurality of raised structures each extending from a first recess portion of the wafer, wherein the first ring structure surrounds the first recess portion and the first plurality of raised structures, wherein at least thirty percent (30%) of a total area surrounded by the first ring structure in a first plane is taken up by the first plurality of raised structures, and wherein sides of the first ring structure each adjoin a respective street region on the second side. The method further comprises forming integrated circuitry in or on a second side of a semiconductor substrate, the second side opposite the first side, and forming in the semiconductor substrate vias extending from the integrated circuitry to the first side.

In an embodiment, forming the redistribution layer comprises forming the multiple ring structures, and, for each of the multiple ring structures, forming a respective plurality of raised structures, wherein, for each of the multiple ring structures the ring structure surrounds a respective recess portion of the wafer, wherein the respective plurality of raised structures each extend from the respective recess portion, wherein at least thirty percent (30%) of a total area surrounded by the ring structure in the first plane is taken up by the respective plurality of raised structures, wherein sides of the ring structure each adjoin a respective street region on the second side.

In another embodiment, the method further comprises dicing the wafer to form a first integrated circuit die including the first ring structure. In another embodiment, the first ring structure adjoins a periphery of the second side. In another embodiment, at least fifty percent (50%) of the total area surrounded by the first ring structure in the first plane is taken up by the first plurality of raised structures. In another embodiment, at least seventy percent (70%) of the total area surrounded by the first ring structure in the first plane is taken up by the first plurality of raised structures. In another embodiment, the first plurality of raised structures includes first interconnect structures each electrically coupled to a respective one of the vias, and dummy structures each electrically decoupled from the vias, wherein the dummy structures are at least half (½) of the first plurality of raised structures.

In another embodiment, the dummy structures are at least two-thirds (⅔) of the first plurality of raised structures. In another embodiment, the dummy structures are at least three-fourths (¾) of the first plurality of raised structures. In another embodiment, an average height of the first plurality of raised structures, as measured from the first plane, is within ten percent (10%) of a height of the first ring structure. In another embodiment, the first plurality of raised structures comprises a second ring structure that surrounds others of the first plurality of raised structures. In another embodiment, the second ring structure surrounds all other of the first plurality of raised structures.

Techniques and architectures for improving the protection of circuitry during wafer dicing are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) die comprising:
    a semiconductor substrate including a first side and a second side opposite the first side;
    integrated circuitry formed in or on the second side;
    vias extending through the semiconductor substrate from the integrated circuitry to the first side; and
    a redistribution layer disposed on the first side, the redistribution layer including:
        a first ring structure; and
        a first plurality of raised structures each extending from a first recess portion of the IC die, wherein the first ring structure surrounds the first recess portion and the first plurality of raised structures, wherein, for any conductive path of the IC die that extends through the first plane and further through the semiconductor substrate to couple to the integrated circuitry, the conductive path extends through the first recess portion, wherein at least thirty percent (30%) of a total area surrounded by the first ring structure in a first plane is taken up by the first plurality of raised structures.

2. The IC die of claim 1, wherein the first ring structure adjoins a periphery of the second side.

3. The IC die of claim 1, wherein at least fifty percent (50%) of the total area surrounded by the first ring structure in the first plane is taken up by the first plurality of raised structures.

4. The IC die of claim 1, wherein the first plurality of raised structures includes:
    first interconnect structures each electrically coupled to a respective one of the vias; and
    dummy structures each electrically decoupled from the vias, wherein the dummy structures are at least half (½) of the first plurality of raised structures.

5. The IC die of claim 1, wherein, as measured from the first plane, an average height of the first plurality of raised structures is within ten percent (10%) of a height of the first ring structure.

6. The IC die of claim 1, wherein the first plurality of raised structures comprises a second ring structure that surrounds others of the first plurality of raised structures.

7. The IC die of claim 6, wherein the second ring structure surrounds all other of the first plurality of raised structures.

8. A wafer comprising:
    a semiconductor substrate including a first side and a second side opposite the first side;
    integrated circuitry formed in or on the second side;
    vias extending through the semiconductor substrate from the integrated circuitry to the first side; and
    a redistribution layer disposed on the first side, the redistribution layer including:
        a first ring structure; and
        a first plurality of raised structures each extending from a first recess portion of the wafer, wherein the first ring structure surrounds the first recess portion and the first plurality of raised structures, wherein at least thirty percent (30%) of a total area surrounded by the first ring structure in a first plane is taken up by the first plurality of raised structures;
    wherein sides of the first ring structure each adjoin a respective street region on the second side.

9. The wafer of claim 8, the redistribution layer further comprising multiple ring structures and, for each of the multiple ring structures, a respective plurality of raised structures, wherein, for each of the multiple ring structures:

the ring structure surrounds a respective recess portion of the wafer, wherein the respective plurality of raised structures each extend from the respective recess portion, wherein at least thirty percent (30%) of a total area surrounded by the ring structure in the first plane is taken up by the respective plurality of raised structures, wherein sides of the ring structure each adjoin a respective street region on the second side.

10. The wafer of claim 8, wherein the first ring structure adjoins a periphery of the second side.

11. The wafer of claim 8, wherein at least fifty percent (50%) of the total area surrounded by the first ring structure in the first plane is taken up by the first plurality of raised structures.

12. The wafer of claim 8, wherein the first plurality of raised structures includes:

first interconnect structures each electrically coupled to a respective one of the vias; and dummy structures each electrically decoupled from the vias, wherein the dummy structures are at least half (½) of the first plurality of raised structures.

13. The wafer of claim 8, wherein, as measured from the first plane, an average height of the first plurality of raised structures is within ten percent (10%) of a height of the first ring structure.

14. The wafer of claim 8, wherein the first plurality of raised structures comprises a second ring structure that surrounds others of the first plurality of raised structures.

15. The wafer of claim 14, wherein the second ring structure surrounds all other of the first plurality of raised structures.

16. A method comprising:

forming, on a first side of a semiconductor substrate of a wafer, a redistribution layer including:

a first ring structure; and a first plurality of raised structures each extending from a first recess portion of the wafer, wherein the first ring structure surrounds the first recess portion and the first plurality of raised structures, wherein at least thirty percent (30%) of a total area surrounded by the first ring structure in a first plane is taken up by the first plurality of raised structures, and wherein sides of the first ring structure each adjoin a respective street region on the second side;

forming integrated circuitry in or on a second side of a semiconductor substrate, the second side opposite the first side;

forming in the semiconductor substrate vias extending from the integrated circuitry to the first side.

17. The method of claim 16, wherein forming the redistribution layer comprises:

forming the multiple ring structures; and for each of the multiple ring structures, forming a respective plurality of raised structures;

wherein, for each of the multiple ring structures:

the ring structure surrounds a respective recess portion of the wafer, wherein the respective plurality of raised structures each extend from the respective recess portion, wherein at least thirty percent (30%) of a total area surrounded by the ring structure in the first plane is taken up by the respective plurality of raised structures, wherein sides of the ring structure each adjoin a respective street region on the second side.

18. The method of claim 16, further comprising dicing the wafer to form a first integrated circuit die including the first ring structure.

19. The method of claim 16, wherein the first ring structure adjoins a periphery of the second side.

20. The method of claim 16, wherein at least fifty percent (50%) of the total area surrounded by the first ring structure in the first plane is taken up by the first plurality of raised structures.

21. The method of claim 16, wherein the first plurality of raised structures includes:

first interconnect structures each electrically coupled to a respective one of the vias; and dummy structures each electrically decoupled from the vias, wherein the dummy structures are at least half (½) of the first plurality of raised structures.

22. The method of claim 16, wherein, as measured from the first plane, an average height of the first plurality of raised structures is within ten percent (10%) of a height of the first ring structure.

23. The method of claim 16, wherein the first plurality of raised structures comprises a second ring structure that surrounds others of the first plurality of raised structures.

24. The method of claim 23, wherein the second ring structure surrounds all other of the first plurality of raised structures.

* * * * *